United States Patent
Matsunaga et al.

[11] Patent Number: 5,951,474
[45] Date of Patent: *Sep. 14, 1999

[54] MAGNETIC RESONANCE IMAGING APPARATUS FOR DETECTING MAGNETIC RESONANCE SIGNALS BY RADIO FREQUENCY RECEIVING COILS

[75] Inventors: Yoshikuni Matsunaga, Hachioji; Tetsuhiko Takahashi, Soka, both of Japan

[73] Assignee: Hitachi Medical Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/804,925

[22] Filed: Feb. 24, 1997

[30] Foreign Application Priority Data

Apr. 26, 1996 [JP] Japan .................................. 8-129316

[51] Int. Cl.$^6$ .................................................. A61B 5/055
[52] U.S. Cl. ........................... 600/422; 324/318; 324/322
[58] Field of Search ............................. 128/653.2, 653.5; 324/318, 322; 600/410, 422

[56] References Cited

U.S. PATENT DOCUMENTS

| | | | |
|---|---|---|---|
| 4,733,190 | 3/1988 | Dembrinski | 324/318 |
| 4,739,269 | 4/1988 | Kopp | 324/318 |
| 4,918,388 | 4/1990 | Mehdizadeh | 324/322 |
| 4,920,318 | 4/1990 | Misic et al. | 324/318 |
| 5,198,768 | 3/1993 | Keren | 324/318 |
| 5,270,656 | 12/1993 | Roberts et al. | 324/318 |
| 5,277,183 | 1/1994 | Vij | 128/653.5 |
| 5,296,813 | 3/1994 | Holmes et al. | 324/322 |
| 5,307,806 | 5/1994 | Jones | 128/653.5 |
| 5,351,688 | 10/1994 | Jones | 128/653.5 |
| 5,361,765 | 11/1994 | Herihy | 128/653.5 |
| 5,370,118 | 12/1994 | Vij | 128/653.5 |
| 5,394,087 | 2/1995 | Molyneaux | 324/318 |
| 5,465,719 | 11/1995 | Itagaki et al. | 128/653.5 |
| 5,473,251 | 12/1995 | Mori | 324/318 |
| 5,500,596 | 3/1996 | Grist et al. | 324/318 |
| 5,502,387 | 3/1996 | McGill | 324/318 |
| 5,581,185 | 12/1996 | Petropoulos et al. | 324/318 |
| 5,655,533 | 8/1997 | Petropoulos et al. | 128/653.5 |

FOREIGN PATENT DOCUMENTS

0565178 A1  1/1993  European Pat. Off. .

OTHER PUBLICATIONS

"A Highly Sensitive Multiple RF Coil For Magnetic Resonance Imaging", T. Takahashi et al, Research & Development Center, Hitachi Medical Corporation, pp. 215–217.

*Primary Examiner*—Francis J. Jaworski
*Assistant Examiner*—Eleni Mantis Mercader
*Attorney, Agent, or Firm*—Antonelli, Terry, Stout & Kraus, LLP

[57] ABSTRACT

RF receiving coil device used in a magnetic resonance imaging apparatus capable of acquiring a tomographic image of an object under examination positioned in a static magnetic field along a predetermined direction including quadrature detection coils for detecting an MR signal component along a direction perpendicular to a body axis direction of the object under examination and also perpendicular to a direction of the static magnetic field, and for detecting another MR-signal component along the body axis direction.

24 Claims, 6 Drawing Sheets

DIRECTION OF STATIC MAGNETIC FIELD

MR SIGNAL
BODY AXIS

MAGNETIC RESONANCE IMAGING APPARATUS FOR DETECTING MAGNETIC RESONANCE SIGNALS BY RADIO FREQUENCY RECEIVING COILS

BACKGROUND OF THE INVENTION

The present invention generally relates to a radio frequency (RF) coil arrangement used in a magnetic resonance imaging apparatus (MRI apparatus) for detecting magnetic resonance signals (MR signals) emitted from hydrogen and phosphor atoms contained in an object under examination such as a human body, and for imaging a density distribution and a relaxation time distribution of nuclei spins contained in the object under examination. More specifically, the present invention is directed to such an RF coil arrangement used in a vertical magnetic field type MRI apparatus in which a direction of a static magnetic field is a vertical direction with respect to a body axis of the object under examination.

MRI apparatuses are employed so as to acquire tomographic images of objects under examination by utilizing the MRI phenomenon. That is, pulsatory RF magnetic fields are applied to an object under examination positioned in a static magnetic field, so that the nuclear magnetic resonance (NMR) phenomenon occurs in nuclei spins such as hydrogen for constituting a tissue of the object under examination. Then, MR signals corresponding to electromagnetic waves emitted from the nuclei spins are detected to reconstruct a tomographic image by using the detected MR signals.

In MRI apparatuses, RF coil arrangements are utilized so as to apply RF pulses and also detect MR signals. As an RF coil arrangement used in a horizontal magnetic field type MRI apparatus whose static field direction is located in parallel to a body axis direction of an object under examination, there are used a solenoid coil; various sorts of quadrature detection (QD) coils, which may surround a region of interest of this object under examination; and either an array coil or a QD array coil used only to a specific portion of this object under examination. The QD coil is known from the QD method of "Journal of Magnetic Resonance" volume 54, in 1983, pages 324 to 327. In this QD method, the linear magnetic field signals are detected by two sets of coils positioned perpendicular to each other, and then the phases of the linear magnetic field signals detected by these two coils are mutually shifted by 90 degrees. Thereafter, the phase-shifted signals are combined with each other, so that the rotation magnetic field signals are detected in a high sensitivity. In such an ideal case that the strengths of the signals detected by the two coils located perpendicular to each other are equal to each other, the resultant sensitivity can be increased by root of 2 times higher than that of a single linear magnetic field detecting method. On the other hand, the array coil is described in "Magnetic Resonance in Medicine" volume 16, in 1990, pages 192 to 225, and U.S. Pat. No. 4,825,162, namely the phased array coil techniques. Generally speaking, a small sized coil owns a relatively higher signal receiving sensitivity than a signal receiving sensitivity of a large sized coil. It should be noted that a signal receiving sensitivity region of such a small sized coil becomes narrower than that of the large sized coil. On the other hand, the array coil described in the publications is arranged by a plurality of small-sized unit coils having high sensitivities in such a manner that interference produced between the adjacent unit coils becomes minimum. Accordingly, the field of this array coil (namely, high sensitivity region of array coil) can be essentially enlarged while maintaining the high sensitivity.

With respect to the QD coil for the vertical magnetic field type MRI apparatus, for instance, JP-A-3-268744 and JP-A-5-317284 describe the head portion imaging reception coil and the abdominal portion imaging reception coil, which are constituted by combining the solenoid coil with the saddle coil.

Also, JP-A-6-14901 and "SNR and Noise-Correlation of CP-volume-Array-Coils" written by L. Kreischer et al, Proceeding of Society of Magnetic Resonance, in 1995, page 980 have proposed the horizontal magnetic field type QD array coil in which a plurality of rectangular coils and a plurality of coils having a shape of FIG. 8 are arranged.

The above-described conventional QD coil used in the vertical magnetic field type MRI apparatus owns the following problems. That is, since two sets of coils for constituting this QD coil own shapes for surrounding the region of interest of the object under examination, the sensitivities of these coils are lowered due to the adverse influences caused by the object under examination in such a middle field strength (for example, 1 Tesla) MRI apparatus. Thus, the image quality of the resultant tomographic images is not so high. Even in such a low field strength (for example, 0.3 Tesla) MRI apparatus, when this QD coil is used as the coil only for a knee and a foot neck of a human body, a region of interest is fixed by this QD coil. Accordingly, it is practically difficult to image the human body while varying the attitude of this human body, for instance, bending or expanding. On the other hand, the above-explained conventional QD array coil is designed for the horizontal magnetic field type MRI apparatus, but not intended to be used in the vertical magnetic field type MRI apparatus.

SUMMARY OF THE INVENTION

Therefore, an object of the present invention is to provide an RF coil arrangement constructed by employing at least one set of QD coils and capable of achieving a high sensitivity in a middle field strength MRI apparatus. Furthermore, another object of the present invention is to provide an RF probe used in a vertical magnetic field type MRI apparatus having a low static field strength, capable of acquiring a tomographic image of an object under examination such as a human body, while changing an attitude of this human body, for instance, bending and expanding of a knee portion thereof.

To achieve the above-described objects, an RF coil arrangement, according to an aspect of the present invention, used in a magnetic resonance imaging apparatus capable of acquiring a tomographic image of an object under examination positioned in a static magnetic field along a predetermined direction is featured by comprising:

quadrature detection coils for detecting an MR (magnetic resonance) signal component along a direction perpendicular to a body axis direction of the object under examination and also perpendicular to a direction of the static magnetic field, and for detecting another MR signal component along the body axis direction; wherein:

one pair of the quadrature detection coils are arranged opposite to each other in such a manner that the quadrature detection coils sandwich a region of interest of the object under examination.

Furthermore, according to another aspect of the present invention, an RF (radio frequency) coil arrangement used in a magnetic resonance imaging apparatus capable of acquiring a tomographic image of an object under examination positioned in a static magnetic field along a preselected direction is featured by comprising:

quadrature detection coils for detecting an MR (magnetic resonance) signal rotated on an X-Y plane involving an X direction and a Y direction perpendicular to the X direction, and perpendicular to a Z direction of the static magnetic field; wherein:

one pair of the quadrature detection coils are arranged opposite to each other in such a manner that the quadrature detection coils sandwich the static magnetic field and are separated from each other along the X direction;

the quadrature detection coils include a rectangular coil and a butterfly type coil arranged in an overlapping manner within a Z-Y plane involving the Z direction and the Y direction;

the rectangular coil is arranged so as to detect the MR signal component along the X direction; and the butterfly type coil is arranged so as to detect the MR signal along the Y direction.

Then, since one pair of QD coils are made from a QD coil constructed of a rectangular coil and a butterfly type coil, the adverse influences caused by the object under examination can be reduced even in such a middle field strength MRI apparatus, the static field strength thereof is selected to be on the order of 1 Tesla. Also, the tomographic images having the better image quality can be acquired while increasing the signal receiving sensitivities of the QD coils.

In addition, the QD coils are made in a curved shape, so that the high sensitivity can be achieved in a central portion of the object under examination. Also, since the plate-shaped QD coils are arranged opposite to each other while sandwiching the object under examination, the plate-shaped QD coils can be easily mounted on the knee portion of the human body, and also the tomographic imaging operation can be done while readily changing the attitude of this knee portion, for example, bending and expanding of this knee portion.

BRIEF DESCRIPTION OF THE DRAWINGS

The present invention may be best understood by reading a detailed description in conjunction with the accompanying drawings, in which.

DESCRIPTION OF THE PREFERRED EMBODIMENTS

Referring now to drawings, various embodiments of the present invention will be described in detail.

Figure 8:
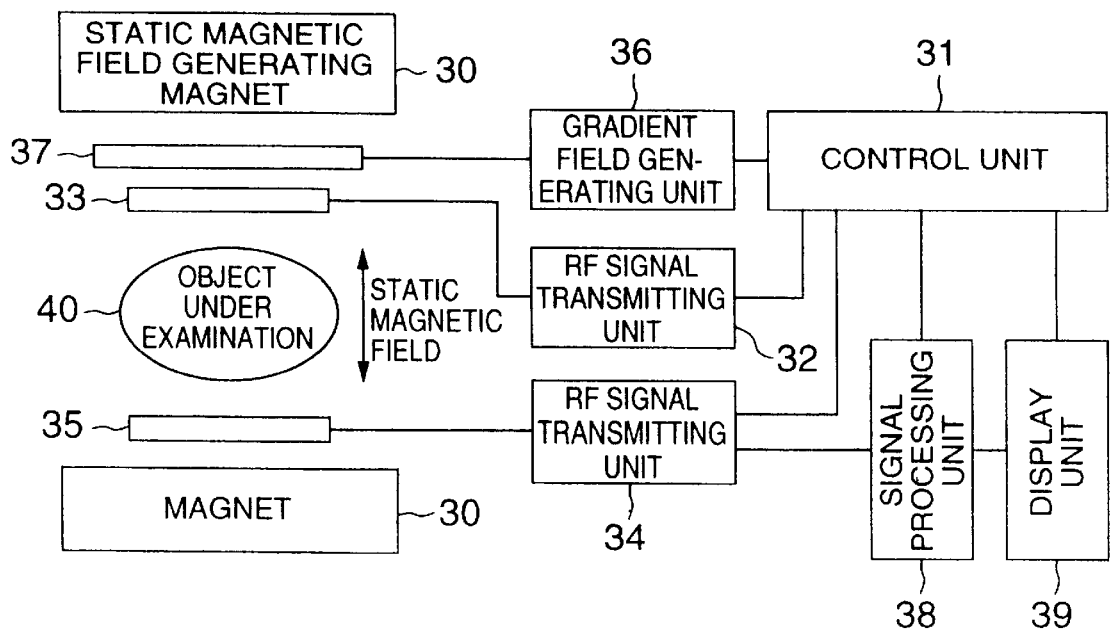
FIG. 8 schematically indicates an entire arrangement of an MR imaging apparatus to which the present invention is applied.

FIG. 8 is a schematic block diagram for showing an example of an entire arrangement of an MRI (magnetic resonance imaging) apparatus to which an RF coil arrangement of the present invention is applied. There are two magnetic field systems in an MRI apparatus, i.e., a horizontal magnet field system and a vertical magnetic field system, depending upon a direction of a magnetic field. It should be understood that the present invention is directed to the latter system, namely the vertical magnetic field system. A static magnetic field generating magnet 30 is provided around an object under examination 40 in this MRI apparatus, and this static magnetic field generating magnet 30 generates a strong and uniform static magnetic field along the vertical direction with respect to a body axis of the object 40 under examination. In addition to this magnet 30, this MRI apparatus is arranged by an RF (radio frequency) signal transmitting unit 32 for transmitting an RF signal to the object under examination 40, and an RF signal receiving unit 34 for receiving an MR (nuclear magnetic resonance) signal, namely an RF signal emitted from the object 40 under examination. This MRI apparatus is further arranged by a gradient magnetic field generating unit 34 for generating gradient magnetic fields along the three axial (X, Y, Z) directions, which are superimposed with a static magnetic field, and a signal processing unit 38 for executing a process operation (for example, Fourier transformation, and correction) with respect to the received MR signal, and also a display unit 39 such as a CRT for displaying an image, and furthermore a control unit 31 for controlling these circuit units.

The RF signal outputted form the RF signal transmitting unit 32 is transmitted to a transmitting RF coil arrangement 33 so as to irradiate the RF signal (electro-magnetic waves) to the object 40 under examination. The output from the gradient magnetic field generating unit 36 is supplied to a gradient magnetic field coil 37, so that gradient magnetic fields "Gx", "Gy", "Gz" are produced along the three axial directions perpendicular to each other. Applications of these gradient magnetic fields may set tomographic imaging planes of the object 40 under examination. The RF signal receiving unit 34 receives the RF signal (MR signal) emitted from the object 40 under examination through a receiving RF coil arrangement 35. In FIG. 8, the transmitting RF coil arrangement 33, the receiving RF coil arrangement 35, and the gradient magnetic field coil 37 are arranged in a space around the object 40 under examination. An RF shield (not shown) for cutting out RF noise externally supplied thereto is made between the RF coil arrangements 33, 35 and the gradient magnetic field coil 37.

It should be understood that an RF coil arrangement according to the present invention is applied to such a receiving RF probe 35 employed in the MRI apparatus. That is, at least one pair of QD (quadrature detection) coils constituted by a rectangular coil and a butterfly type coil are arranged opposite to each other in such a manner that a region of interest of the object 40 under examination is sandwiched by these QD coils in a plane involving the static magnetic field direction and the body axis direction of the object under examination, which is located perpendicular to this static magnetic field direction.

Figure 1:
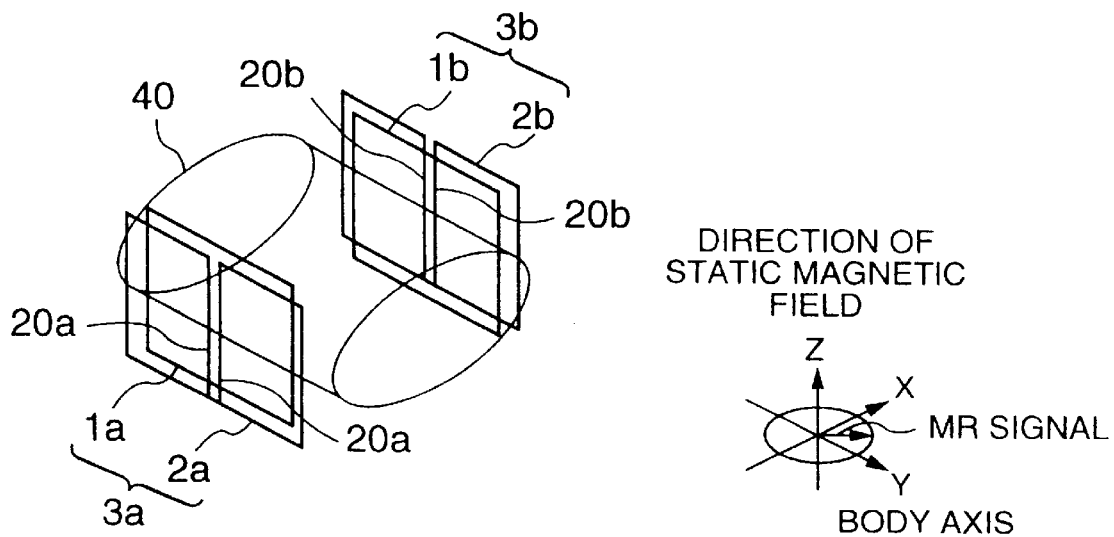
FIG. 1 schematically represents a structure of an RF coil arrangement according to an embodiment of the present invention.

FIG. 1 schematically indicates an RF (radio frequency) coil arrangement according to an embodiment of the present invention. As illustrated in FIG. 1, a first QD (quadrature detection) coil 3a and a second QD coil 3b are arranged in parallel to each other in an Y-Z plane. The first QD coil 3a is formed in a plate shape by overlapping a rectangular coil 1a on a butterfly type coil 2a, and similarly the second QD coil 3b is formed in a plate shape by overlapping a rectangular coil 1b on a butterfly type coil 2b. Two sets of QD coils 3a and 3b are positioned opposite to each other by sandwiching the object 40 under examination. In this embodiment, a region of interest (ROI) corresponds to an abdominal portion of a human body, a static magnetic field direction corresponds to a Z-direction, and a body axial direction of the body under examination corresponds to a Y-direction. Although not shown in this drawing, each of these QD coils 3a and 3b is covered with a stiff insulating material made of synthetic resin and so on, and these QD coils may be easily mounted on the body 40 under examination.

Since the RF coil arrangement according to this embodiment may be mounted in such a manner that after the object 40 under examination lies on a couch (not shown), this RF coil arrangement sandwiches the object 40 under examination, this RF coil arrangement can be readily mounted on the object 40 under examination, but also can mitigate a sense of oppression given to the object 40 under examination.

The rectangular coils and the butterfly type coils, which constitute such QD coils, may detect the RF magnetic fields along the directions perpendicular to each other. In other words, the rectangular coils 1a and 1b detect an X-direction component of an MR signal rotated on an X-Y plane perpendicular to the static magnetic field direction, whereas the butterfly type coils 2a and 2b detect a Y-direction component thereof. Thus, the signal components detected by the respective coils will be processed in a signal reception system (will be discussed later).

Each of the butterfly type coils 2a and 2b is made of a conductor having a substantially FIG. 8 shape by coupling two sets of loops. A central portion where two loops of each butterfly type coil are intersected with each other owns two sets of conductors 20a and 20b extending substantially parallel to the vertical static magnetic field. In response to the MR signal along the body axis direction Y, currents are induced in the two sets of conductors 20a and 20b of this central portion along the same direction, so that the Y-direction component of the MR signal rotated on the X-Y plane may be detected by these conductors.

It should be noted that since the directions of the magnetic fields produced by either the rectangular coil 1a and the butterfly type coil 2a or the rectangular coil 1b and the butterfly type coil 2b are located perpendicular to each other, no inductive coupling is produced between these coils. To the contrary, a small inductive coupling is produced in either the rectangular coils 1a and 1b or the butterfly type coils 2a and 2b. However, since this small inductive coupling may be reduced by utilizing the known techniques such as the reducing method by using the preamplifier having the low input impedance, a high sensitivity can be established by the compact QD coil.

The above-described rectangular coils 1a, 1b and butterfly type coils 2a, 2b are brought into the parallel resonant conditions in a desirable frequency in conjunction with a resonant capacitance element and a matching capacitance element, and thus owns a desirable output impedance (for instance, 200 Ω). It should be understood that when MR signals emitted from hydrogen nuclei are detected under such a condition that the strength of the static magnetic field is selected to be 1 Tesla, the resonant frequency is selected to be 42.6 MHz.

Figure 2A:
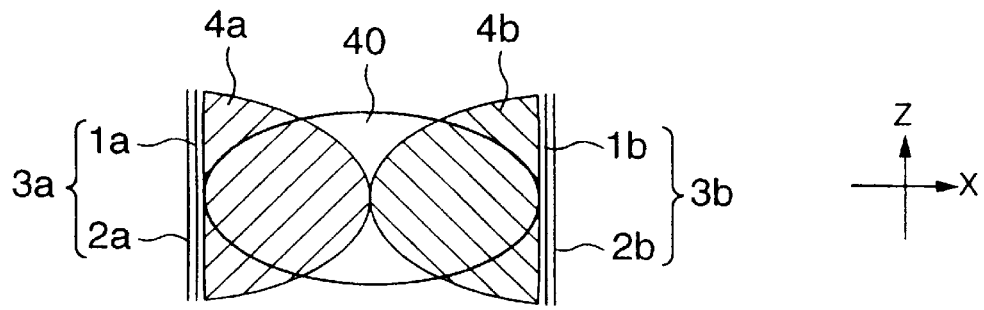
FIG. 2A and FIG. 2B indicate reception sensitivity distributions of the RF coil arrangement shown in FIG. 1 on the Z-X plane and X-Y plane, respectively.
Figure 2B:
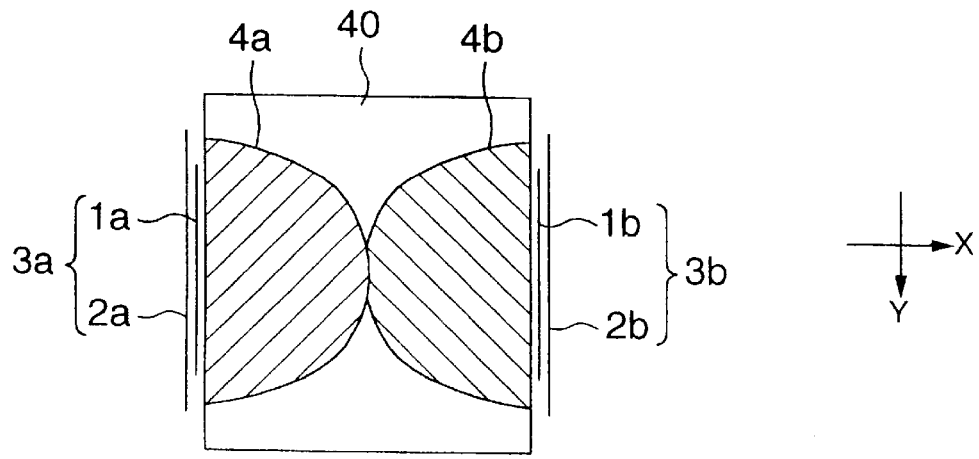

There is shown a sensitivity distribution of the RF probe according to this embodiment in FIG. 2A and FIG. 2B. That is, FIG. 2A represents a sensitivity distribution in the X-Z plane, and FIG. 2B shows a sensitivity distribution in the X-Y plane. As indicated in FIG. 2A and FIG. 2B, the RF probe of FIG. 1 according to this embodiment owns a high sensitivity region 4a of the QD coil 3a and a high sensitivity region 4b of the QD coil 3b. These QD coil 3a and 3b are symmetrical to each other, as viewed in the drawing. The high sensitivity regions of the RF probe according to this embodiment may substantially cover the object 40 under examination located near the coils. However, the high sensitivity regions of this RF probe are brought into a lack condition at the central portion of the object 40 under examination. While this high sensitivity region is specific to a surface coil, this high sensitivity region is determined based on the dimensions of the rectangular coils 1a, 1b and the butterfly type coils 2a, 2b, which constitute the QD coils 3a and 3b. As a consequence, when the dimensions of the respective coils are made larger, the high sensitivity regions may be enlarged over the central portion of the object 40 under examination. However, the sensitivities would be lowered in this case. Conversely, when the dimensions of the respective coils are made smaller, the sensitivities thereof are increased, but the high sensitivity regions thereof are reduced. Accordingly, it is preferable to select the dimensions of the respective coils under such a condition that while the sensitivities thereof are not extremely reduced, the high sensitivity regions may reach the central portion of the body 40 under examination.

Figure 3:
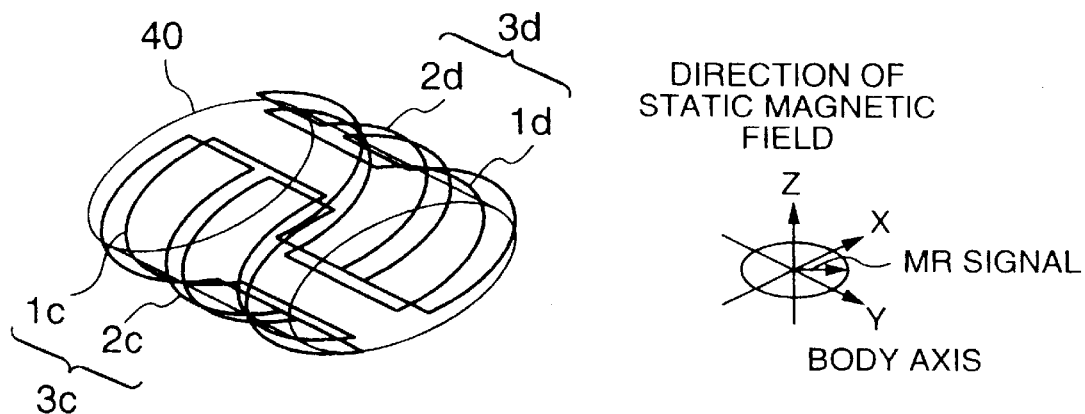
FIG. 3 schematically indicates a structure of an RF coil arrangement according to another embodiment of the present invention.
Figure 4A:
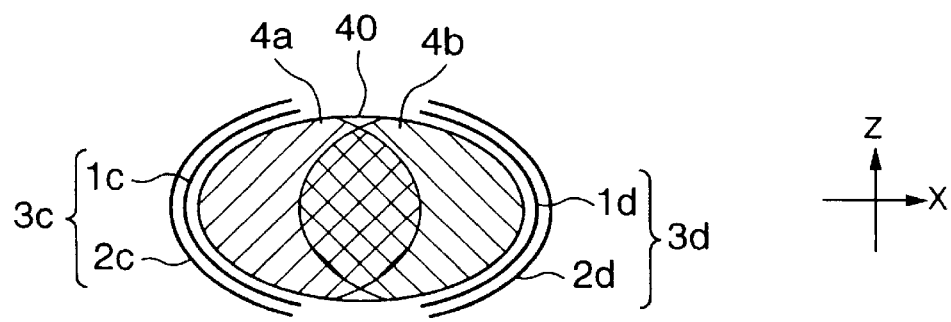
FIG. 4A and FIG. 4B indicate reception sensitivity distributions of the RF probe shown in FIG. 3 on the Z-X plane and the X-Y plane, respectively.
Figure 4B:
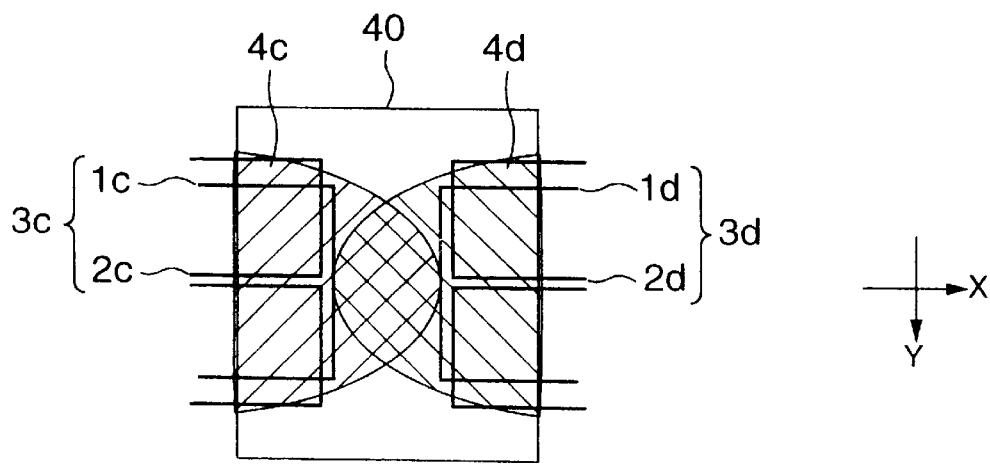

FIG. 3 schematically shows an RF coil arrangement according to another embodiment of the present invention. This embodiment owns such a structural difference from that of the above-described embodiment. That is, rectangular coils 1c, 1d and butterfly type coils 2c, 2d, which constitute two sets of QD coils 3c and 3d are curved in fitting with a surface shape of the object 40 under examination so as to be located very close to this object 40 under examination. As a result, the RF coil arrangement according to this embodiment, as represented in FIG. 4A and FIG. 4B, owns such a sensitivity distribution that a high sensitivity region 4c of the QD coil 3c is overlapped with a high sensitivity region 4d of the QD coil 3d at a central position of the object 40 under examination. Thus, the high sensitivities can be achieved in overall region of the object 40 under examination. It should also be noted that the respective QD coils 3c and 3d are covered with a flexible insulating material, and since upper portions thereof are fixed by way of magic tapes (trade name) and the like, these QD coils 3c and 3d may be readily mounted on the object 40 under examination.

Figure 5:
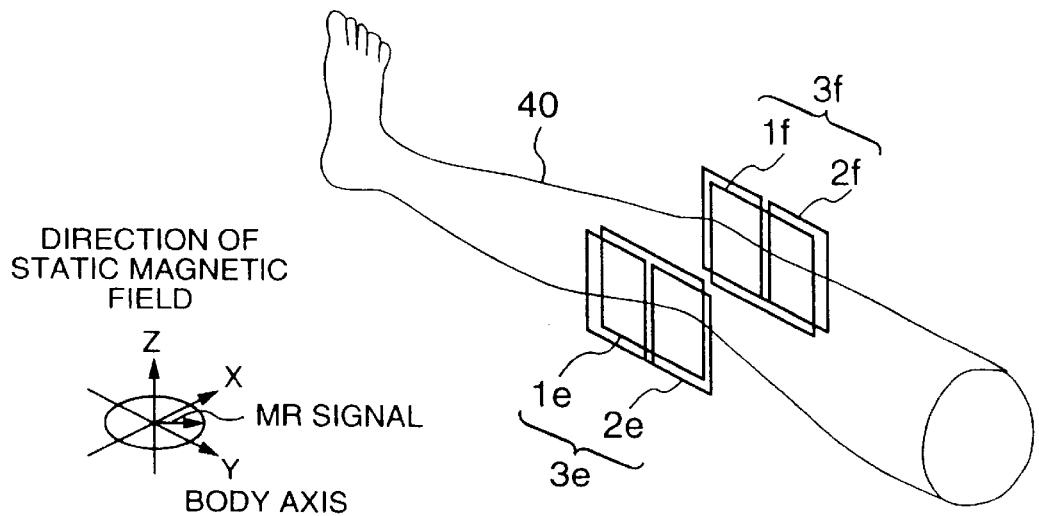
FIG. 5 schematically illustrates an RF probe according to a further embodiment of the present invention.

FIG. 5 schematically shows an RF probe coil arrangement according to a further embodiment of the present invention. In the RF probe according to this embodiment, dimensions of rectangular coils 1e, 1f and also of butterfly type coils 2e, 2f, which constitute two sets of QD coils 3e, 3f, are made small, as compared with the RF coil arrangement according to the embodiment shown in FIG. 1. In this RF coil arrangement of FIG. 5, a region of interest of the object 40 under examination corresponds to a knee thereof. Since the RF probe according to this embodiment has a structure that an upper portion thereof is opened, there is a merit that various MR imaging operations with a high sensitivity can be readily carried out while joint portions such as a knee corresponding to the region of interest are bent and/or expanded.

Next, a description will now be made of a signal receiving system 34 for receiving an MR signal detected by the RF coil arrangement according to the present invention.

Figure 6:
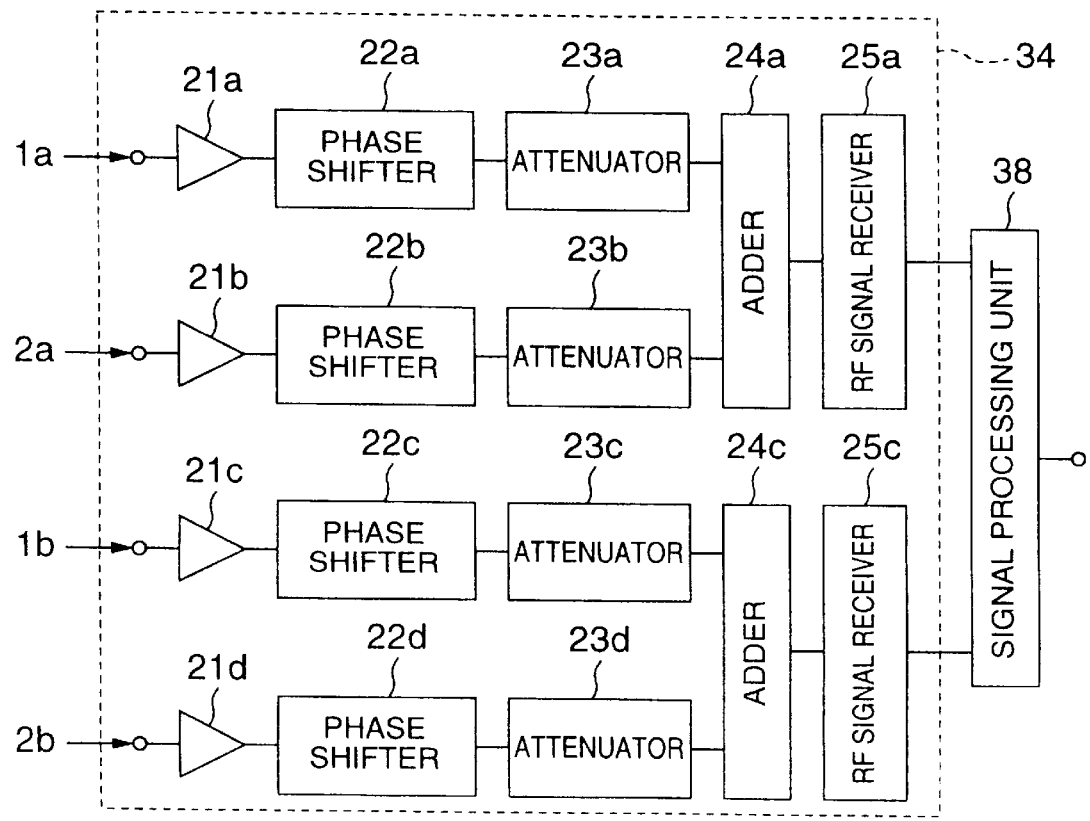
FIG. 6 is a schematic block diagram for showing a partial circuit of a signal reception system to which the present invention is applied.

FIG. 6 is a schematic block diagram for indicating a partial circuit arrangement of the radio frequency (RF) signal receiving unit 34, according to an embodiment. As shown in this drawing, the radio frequency signal receiving unit 34 is constituted by preamplifiers 21a, 21c, 21b, 21d connected to the rectangular coils 1a, 1b, and the butterfly type coils 2a, 2b, which constitute the QD coils 3a and 3b; phase shifters 22a to 22d connected to the respective preamplifiers 21a to 21d; attenuators 23a to 23d connected to the respective phase shifters 22a to 22d; adders 24a and 24c for adding the outputs derived from either the attenuators 23a and 23b or the attenuators 23c and 23d; and RF signal receivers 25a and 25c. The phase shifters 22a and 22b or 22c and 22d are employed so as to make the phases of the signals in-phase conditions, which are derived from the rectangular coils and the butterfly type coils which constitute the QD coils. For instance, assuming now that a phase shift amount of one phase shifters 22a and 22c is 0 degree, a phase shift amount of other phase shifters 22b and 22d is set to be either 90 degrees or −90 degrees. It should be noted that such a fact whether the phase shift amount of the phase shifters 22b and 22d becomes plus or minus may be determined by how to arrange the rectangular coils and the butterfly type coils and how to connect these coils to the preamplifiers. It should also be noted that the phase shift amount may be set by way of not only the above-described manner, but also if a difference in the phase shift amounts of the phase shifters 22a and 22b, or 22c and 22d becomes 90 degrees, than any other setting manners may be employed.

In the above-described circuit arrangement, the MR signals received by the respective QD coils constructed of the rectangular coils and the butterfly type coils are amplified via coaxial cables (not shown in detail) by the preamplifiers 21a to 21d. After the phase shift amounts are controlled in the phase shifters 22a to 22d in order that the phases of the preamplifiers 21a and 21b, or 21c and 21d are made in-phase conditions, the gains are controlled in the attenuators 23a to 23d in such a manner that the adding conditions of the respective QD coils become optimum. The gain-controlled signals are added to each other in the adders, and then the added MR signals are processed by the RF signal receivers 25a and 25c. In this case, as is known in the art, the RF signal receivers 25a and 25c are constituted by a gain controlling amplifier, or and attenuator, a quadrature detector and an A/D converter. In the RF signal receivers 25a and 25c, after the inputted MR signals are gain-controlled, the gain-controlled MR signals are mixed with the sine signal having the reference signal and the cosine signal having the reference signal, and thereafter are detected to derive two series of MR signals. These MR signals are outputted as digital signals. The signal processing unit 38 includes a memory circuit for storing the inputted signal, and stores the digital signals derived from the RF signal receivers 25a and 25c in this memory circuit. Then, these stored digital signals are processed by way of the filtering, the Fourier transformation, the synthesizing, and the correcting processes to thereby reconstruct an image.

Figure 7:
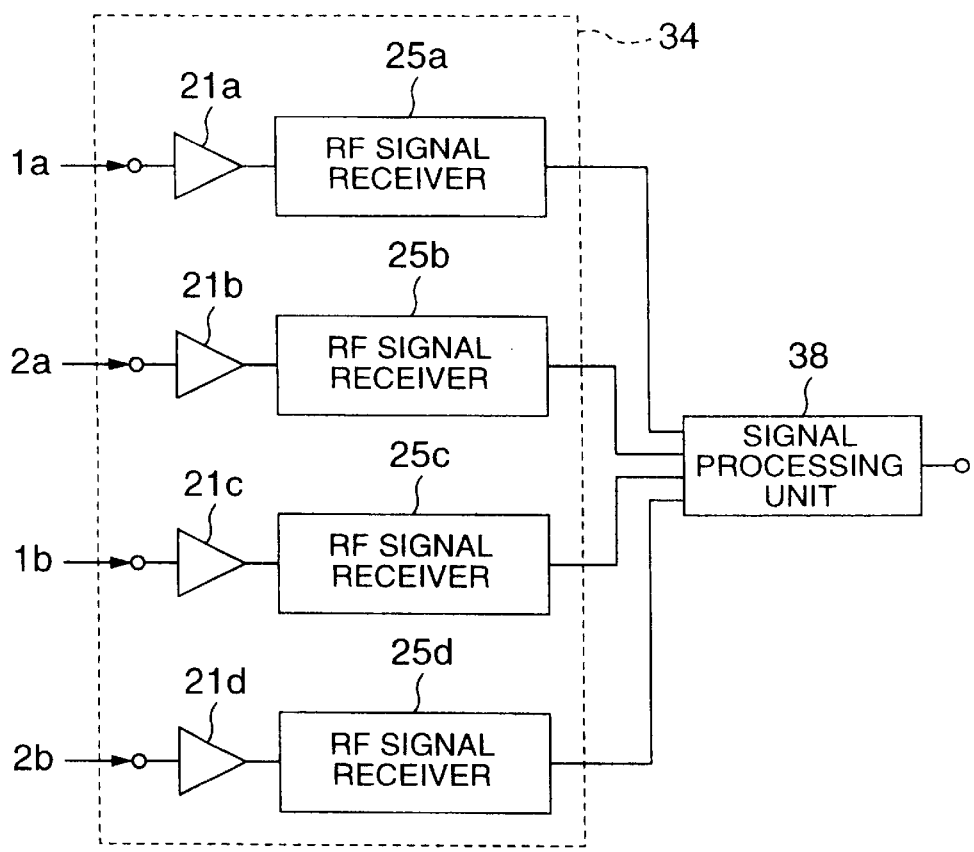
FIG. 7 is a schematic block diagram for representing a partial circuit of another signal reception system to which the present invention is applied.

FIG. 7 is a schematic block diagram for indicating a partial circuit arrangement of another RF signal receiving system to which the RF coil arrangement of the present invention is applied. In this circuit arrangement, the MR signals received by the respective soils of the rectangular coils and the butterfly type coils are amplified by the preamplifiers 21a to 21d, and the amplified MR signals are converted into digital MR signals in two signal systems by the respective RF signal receivers 25a to 25d. Thereafter, the MR signals derived from the QD coils are synthesized in the signal processing unit 38. To this end, the digital signals derived from the respective RF signal receivers 25a to 25d are Fourier-transformed in the signal processing unit 38, and thereafter the Fourier-transformed digital signals are once stored. Then, the MR signals derived from the QD coils are synthesized by, for instance, processing absolute values of the respective Fourier-transformed signals to obtain a square root mean value. As a result, the signals obtained from the rectangular coils and the butterfly type coils may be detected in high sensitivities. This RF signal reception system owns a merit that a phase difference between two coils is no longer controlled.

It should be understood that although the above-explained embodiments have described such an inventive idea that the RF coil arrangement of the present invention is applied to either the abdominal portion or the knee portion, this RF coil arrangement may be applied to any other proper portion, e.g., heads, and accordingly the dimension and also the shape of this RF coil arrangement may be changed in order to be fitted to these portions.

Also, in the above-described embodiment, one pair of QD coils have been arranged on both sides of the object under examination. Alternatively, the RF probe of the present invention is not limited to the above case, but such a QD array coil may be arranged on both sides of the object under examination in such a manner that coil arrays formed by overlapping a plurality of rectangular coils on a plurality of butterfly type coils are arranged on each side of the object under examination.

Figure 9:
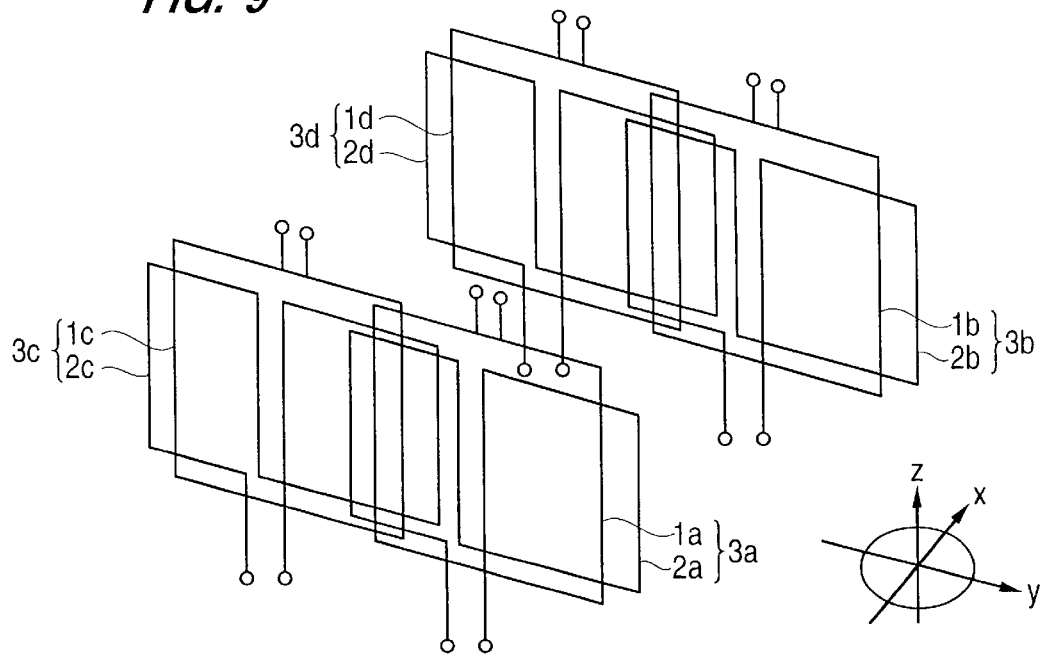
FIG. 9 shows another structure of RF receiving coils including a plurality of rectangular coils and butterfly type coils according to an embodiment of the present invention.
Figure 10:
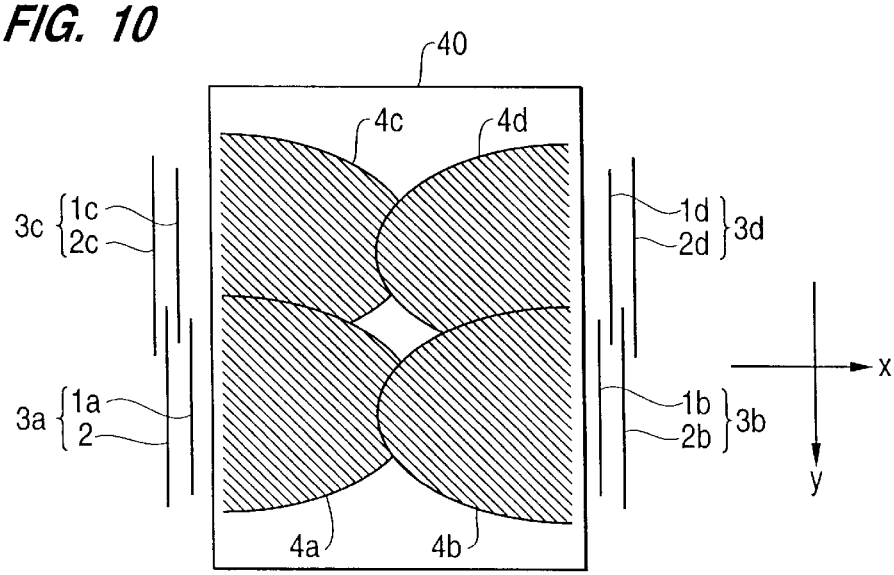
FIG. 10 shows reception sensitivity distributions of the RF receiving coils shown in FIG. 9 on the X-Y plane.
Figure 11:
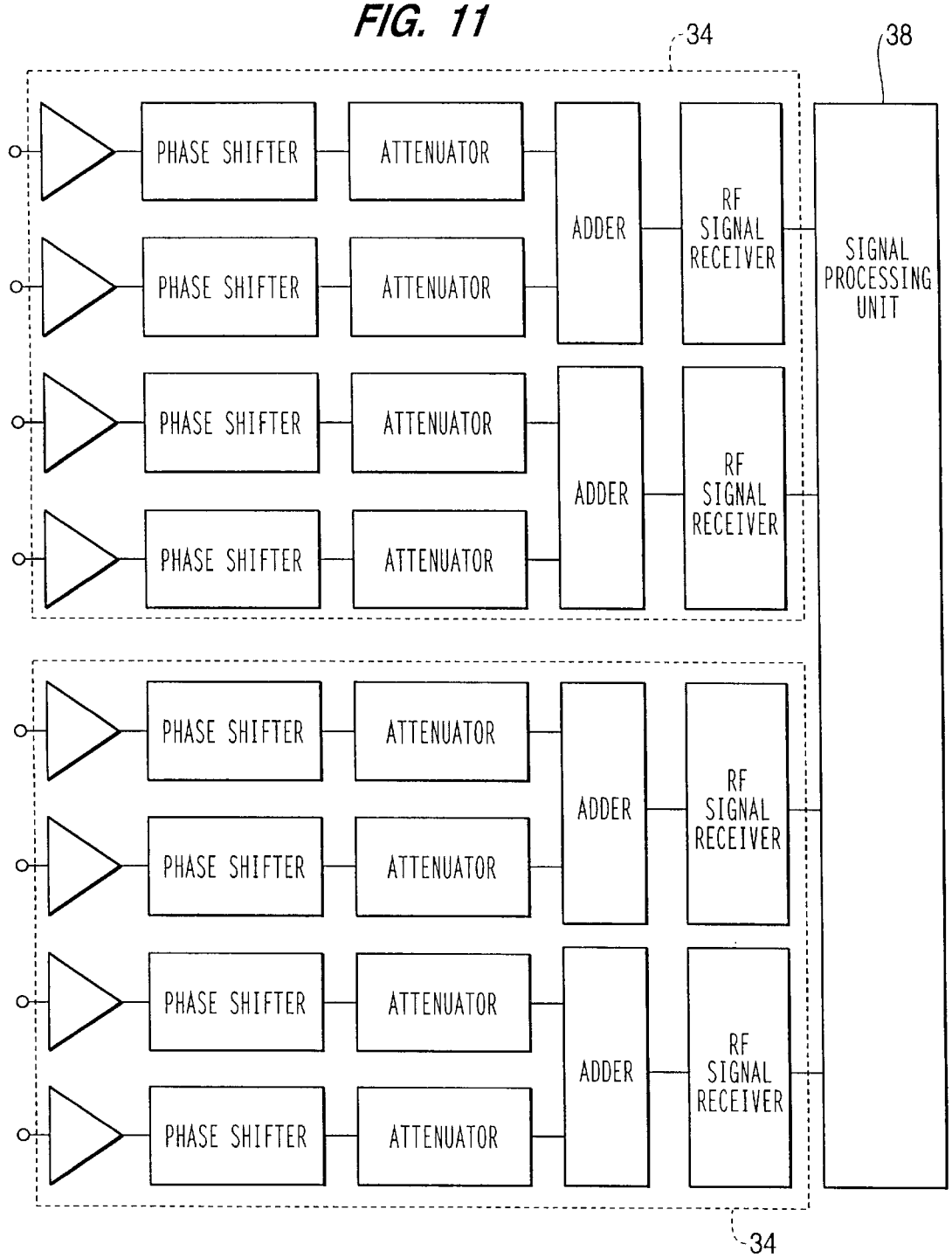
FIG. 11 shows an example of the signal detection circuit which includes two RF signal receiving units connected to the signal processing unit in parallel.

FIG. 9 shows another structure of RF receiving coils including a plurality of rectangular coils and butterfly type coils according to an embodiment of the present invention. Coils 1c, 2c, 3c, 1d, 2d and 3d are the same as the coils 1a, 2a, 3a, 1b, 2b and 3b shown in FIG. 1. A combination of coils 1a, 2a and 3a and another combination of coils 1c, 2c and 3c are arranged to overlap each other. This overlapping structure reduces a mutual coupling between the combination of coils 1a, 2a and 3a and the combination of coils 1c, 2c and 3c. A combination of coils 1b, 2b and 3b and another combination of coils 1d, 2d and 3d are also arranged to overlap each other in the same manner. The overlapping distance between two coil combinations may be adjusted while monitoring a mutual coupling value. FIG. 10 shows reception sensitivity distributions of the RF receiving coils shown in FIG. 9 on the X-Y plane. The field of vision in the Y direction is broadened. This coil structure is suitable for imaging of a wide area of an abdominal region or arms and legs. FIG. 11 shows an example of the signal detection circuit which includes two RF signal receiving units 34 connected to the signal processing unit 38 in parallel. One RF signal receiving unit 34 detects signals from RF coils of a- and b-groups, and another RF signal receiving unit 34 detects signals from RF coils of c- and d-groups. The signal processing unit 38 synthesizes the output signals from the RF signal receiving units 34.

As previously described in detail, as for the reception RF probe according to the present invention for the MRI apparatus, at least one set of QD coils for receiving the RF signals along the two orthogonal directions are arranged opposite to each other so as to sandwich the region of interest of the body under examination within the plane constituted by the static magnetic field direction and the body axis direction of the object under examination, and perpendicular to this static magnetic field direction. Accordingly, since the QD coils constructed of the rectangular coils and the butterfly type coils are employed, even when the strength of the static magnetic field is a medium high field strength on the order of 1 Tesla, the adverse influences caused by the object under examination can be reduced and the RF coil arrangement a high sensitivity can be realized. Furthermore, the QD coil is made in a curved surface, so that the sensitivity of the RF probe in the deep portions of the object under examination can be improved. Moreover, since the plane-shaped QD coils are positioned opposite to each other while sandwiching the object under examination, the MR imaging operations may be performed by varying the attitudes of the object under examination at the portions such as the knee, e.g., bending and expanding of the knee.

What is claimed is:

1. A magnetic resonance imaging apparatus comprising a static magnetic field generator disposed on both sides of an object sandwiched therebetween for generating a vertical static magnetic field in a direction perpendicular to a body axis of said object, an RF transmitting coil device for transmitting a radio frequency signal to said object, and an RF receiving coil device for receiving a magnetic resonance signal from said object, wherein said RF receiving coil comprises:

a pair of quadrature detection coils arranged so as to detect an MR signal component along a direction of said body axis and along a direction perpendicular to any direction of said body axis and said vertical static magnetic field direction; and one of said pair of quadrature detection coils being arranged to be opposite to another of said pair of quadrature detection coils so that said quadrature detection coils sandwich a region of interest of said object, and said quadrature detection coils being arranged to have an extension direction in parallel with said body axis direction and perpendicular to said vertical static magnetic field direction.

2. A magnetic resonance imaging apparatus as claimed in claim 1, wherein said quadrature detection coils include:

a rectangular coil arranged so as to detect the MR signal component along the direction perpendicular to any directions of said body axis and perpendicular to said static magnetic field direction; and a butterfly type coil arranged so as to detect the MR signal component along the body axis direction.

3. A magnetic resonance imaging apparatus as claimed in claim 2, wherein said butterfly type coil is made of a conductor forming an 8-shaped coil having two loops coupled together, and an intersecting portion of said two loops contains two conductors extended substantially parallel to each other along said vertical magnetic field direction.

4. A magnetic resonance imaging apparatus as claim 2, further comprising a signal processing unit for implementing image processing of signals from said rectangular coil and said butterfly type coil individually.

5. A magnetic resonance imaging apparatus as claim 2, further comprising a signal processing unit for implementing image processing of signals from a pair of quadrature detection coils in such a manner that a combination of signals from said rectangular coil and said butterfly type coil at one side of said object are combined together to produce a combined signal, another combination of signals from said rectangular coil and said butterfly type coil at another side of said object are combined together to produce a combined signal, and the combined signals are processed individually.

6. A magnetic resonance imaging apparatus as claimed in claim 1, wherein each of said quadrature detection coils has a planar shape.

7. A magnetic resonance imaging apparatus as claimed in claim 1, wherein said quadrature detection coils have shapes of curved surfaces.

8. A magnetic resonance imaging apparatus as claimed in claim 7, wherein said quadrature detection coils are bent along a surface shape of the region of interest of said object.

9. A magnetic resonance imaging apparatus as claimed in claim 1, wherein each of said quadrature detection coils, include a rectangular coil and a butterfly type coil in overlapping relation.

10. A magnetic resonance imaging apparatus as claimed in claim 9, wherein said butterfly type coil is made of a conductor forming an 8-shaped coil having two loops coupled together, and an intersecting portion of said two loops contains two conductors extended substantially parallel to each other along said static magnetic field direction.

11. A magnetic resonance imaging apparatus as claim 9, wherein said quadrature detection coils form a detection coil array of a plurality of said quadrature detection coils overlapping one another on opposite sides of the region of interest of said object.

12. A magnetic resonance imaging apparatus as claim 11, further comprising a signal processing unit for implementing image processing of a combined signal obtained by the opposed detection coil arrays.

13. A magnetic resonance imaging apparatus as claim 1, further comprising a signal processing unit for implementing image processing of signals from said quadrature detection coils individually.

14. A magnetic resonance imaging apparatus having a static magnetic field generator disposed on both sides of an object sandwiched therebetween for generating a static magnetic field in a direction perpendicular to a body axis of said object, an RF transmitting coil device for transmitting a radio frequency signal to said object, and an RF receiving coil device for receiving a magnetic resonance object, wherein:

said RF receiving coil device comprises quadrature detection coils for detecting an MR signal rotated on an X-Y plane including an X direction and a Y direction perpendicular to said X direction, and perpendicular to a Z direction of said static magnetic field;

one of said quadrature detection coils being arranged opposite to another of said quadrature detection coils in such a manner that said quadrature detection coils sandwich said static magnetic field and are separated from each other along said X direction;

said quadrature detection coils include a rectangular coil and a butterfly type coil arranged in an overlapping manner within a Z-Y plane including said Z direction and said Y direction;

said rectangular coil is arranged so as to detect the MR signal component along the X direction; and said butterfly type coil is arranged so as to detect the MR signal along the Y direction.

15. A magnetic resonance imaging apparatus as claimed in claim 14, wherein said butterfly type coil is made of a conductor forming an 8-shaped coil having two loops coupled together, and an intersecting portion of said two loops contains two conductors extended substantially parallel to each other along said static magnetic field direction.

16. A magnetic resonance imaging apparatus comprising a static magnetic field generator disposed on both sides of an object sandwiched therebetween for generating a vertical static magnetic field in a direction perpendicular to a body axis of said object, an RF transmitting coil device for transmitting a radio frequency signal to said object, and an RF receiving coil device for receiving a magnetic resonance signal from said object, wherein said RF receiving coil device comprises a pair of quadrature detection coils including a butterfly type coil arranged so as to detect an MR signal component along a direction of said body axis, one of said pair of quadrature detection coils being arranged to be opposite to another of said pair of quadrature detection coils so that said quadrature detection coils sandwich a region of interest of said object, and said pair of quadrature detection coils being arranged to have an extension direction in parallel with said body axis direction and perpendicular to said static magnetic field direction.

17. A magnetic resonance imaging apparatus as claim 16, wherein said butterfly type coil is made of a conductor forming an 8-shaped coil having two loops coupled together, and an intersecting portion of said two loops contains two conductors extended substantially parallel to each other along said static magnetic field direction.

18. A magnetic resonance imaging apparatus as claim 16, wherein each of said quadrature detection coils has a planar shape.

19. A magnetic resonance imaging apparatus as claim 16, wherein said quadrature detection coils have shapes of curved surfaces.

20. A magnetic resonance imaging apparatus as claim 16, wherein said quadrature detection coils are bent along a surface shape of the region of interest of said object.

21. A magnetic resonance imaging apparatus as claim 16, wherein each of said quadrature detection coils, include said butterfly type coil and a rectangular coil in overlapping relation.

22. A magnetic resonance imaging apparatus as claim 16, further comprising a signal processing unit for implementing image processing of signals from said quadrature detection coils individually.

23. A magnetic resonance imaging apparatus as claim 16, wherein said quadrature detection coils form a detection coil array of a plurality of said quadrature detection coils overlapping one another on opposite sides of the region of interest of said object.

24. A magnetic resonance imaging apparatus as claim 23, further comprising a signal processing unit for implementing image processing of signals obtained by opposed detection coil arrays.

* * * * *